United States Patent [19]

Higurashi et al.

[11] Patent Number: 5,948,118
[45] Date of Patent: Sep. 7, 1999

[54] ERROR DETECTION CODE FORMING METHOD AND APPARATUS

[75] Inventors: Seiji Higurashi, Tokyo-To; Takeo Ohishi, Yokohama, both of Japan

[73] Assignee: Victor Company of Japan, Ltd., Yokohama, Japan

[21] Appl. No.: 08/721,963

[22] Filed: Sep. 27, 1996

[30] Foreign Application Priority Data

Sep. 27, 1995  [JP]  Japan .................................. 7-249379

[51] Int. Cl.⁶ .......................... H03M 13/00; G11B 20/18
[52] U.S. Cl. .......................................... 714/805; 714/768
[58] Field of Search .................... 371/51.1, 53; 714/805, 714/768

[56] References Cited

U.S. PATENT DOCUMENTS

| | | | |
|---|---|---|---|
| 4,829,525 | 5/1989 | Sugiyama et al. | 371/38 |
| 5,327,438 | 7/1994 | Okuyama | 371/37.1 |
| 5,377,207 | 12/1994 | Perlman | 371/37.1 |
| 5,404,249 | 4/1995 | Seki | 360/48 |
| 5,583,707 | 12/1996 | Seki | 360/48 |
| 5,642,366 | 6/1997 | Lee et al. | 371/39.1 |
| 5,774,289 | 6/1998 | Seki | 360/48 |

OTHER PUBLICATIONS

Peterson et al., "Error–Correcting Codes" second edition, The MIT Press, Dec. 1972, pp. 472–476.
Arazi, "A Commonsense Approach to the Theory of Error Correcting Codes", The MIT Press, Dec. 1988, pp. 140–146.
Blahut, "Theory and Practice of Error Control Codes", Addison–Wesley Publishing Co., Dec. 1983, pp. 80, 81, 162, 163, 174, 175.
Proceedings of the International Symposium on Circuits and Systems, May 10, 1992, vol. 4, Fettweis et al, pp. 1871–1874, "A Combined Reed–Solomon Encoder and Syndrom Generator with Small Hardware Complexity".

Primary Examiner—Stephen M. Baker
Attorney, Agent, or Firm—Jacobson, Price, Holman & Stern, PLLC

[57] ABSTRACT

Identification (ID) error detection codes are formed which are synchronized at least with ID data and digital data of fixed length. The ID data are firstly separated into four-bit units of data. A first data is added to each separated four-bit unit of data. The data to which the first data is added is delayed by a period corresponding to each four-bit data. Further, a second data is added to the delayed data. The data to which the second data is added is delayed by the period corresponding to each four-bit unit of data. The delayed data to which the second data is added is multiplied by a coefficient $\alpha^4$ related to a Galois Field ($2^4$) to generate the second data. Further, the delayed data to which the second data is added is multiplied by a coefficient $\alpha$ related to the Galois Field ($2^4$) to generate the first data. Four-bit Reed-Solomon codes defined on the Galois Field ($2^4$) is thus formed. The Reed-Solomon codes become the ID data error detection codes.

2 Claims, 5 Drawing Sheets

ERROR DETECTION CODE FORMING METHOD AND APPARATUS

The present invention relates to an error detection code forming method and apparatus, and more specifically to a method and apparatus for forming an error detection code such as a parity code each added to each fixed length of digital data as a redundant code.

A conventional apparatus is known for recording digital data on a storage medium and reproducing the recorded digital data therefrom and for receiving and transmitting digital data. In these apparatus, digital data required to be recorded or reproduced are firstly separated into fixed lengths, secondly an error detection code is added to the separated digital data of fixed length together with a synchronization signal and identification (ID) data, such as address data; and then these data are recorded/reproduced or transmitted all together as a unit block signal in a series of block signals.

FIG. 1 shows an example of the format of the unit block. In FIG. 1, one block is composed of 112 bytes including a two-byte synchronization (Sync) area 11 arranged at a head position as a reference for reproduction, a three-byte ID data ID data area 12 (e.g., address data), a 99-byte data field 13, and an eight-byte parity area 14, all arranged in sequence. Here, in the eight-byte parity area 14, a parity code is inserted to detect an error existing in this block. As the parity error code, for instance, a Reed-Solomon code is used.

Here, the three-byte ID data inserted in the area 12 for transmission and reproduction are important data used for returning the normally obtained block to the original position, when a portion of the series of block signals is missing (e.g., ID data on each track are reproduced discontinuously by high-speed reproduction). Therefore, it is necessary to judge whether the reproduced ID data are reliable or not as accurately as possible.

For this purpose, as shown in FIGS. 2A, 2B and 2C, the three-byte ID data are composed of first ID data ID1, second ID data ID2, and ID parity data. Further, the eight-bit first ID data ID1 includes four-bit data 15 and three bit data 16; the eight-bit second ID data ID2 includes part of nine-bit data 17; and the ID parity data includes and eight-bit ID data error detection code (e.g., parity data) for detecting an error of ID data 15, 16 and 17. Here, since being used only to detect an error of the ID data, the above-mentioned parity code is referred to as an ID parity.

Further, the above-mentioned four-bit ID data 15, three-bit ID data 16, and nine-bit ID data 17 are three different ID data, respectively, and the number of bits of these ID data and the number of these ID data are both set to an appropriate value, respectively according to the apparatus to which these ID data are applied. Further, conventionally, the one-byte ID parity as shown in FIG. 2(C) forms a simple parity code constructed as follows:

ID parity=(ID1+ID2) mod 2

Here, ID1 and ID2 denote the first byte ID data and the second byte ID data as shown in FIGS. 2A and 2B, respectively. Here, the above expression indicates that the ID parity code is an addition of corresponding bits of the two ID data ID1 and ID2 by using 2 as modulus. Therefore, the ID parity code can be expressed in terms of 8 codes of (3, 2, 2: code length, data length, minimum distance). In other words, although the one-bit error can be detected, there exists a possibility of a two-bit error is overlooked.

In the conventional error detection code forming method, however, since the (3, 2, 2) codes are formed basically, there exists a possibility of a two-bit error that cannot be detected when it is present. Therefore, in the conventional error detection code forming method, in spite of the fact that errors occur in the ID parity code at a relatively high frequency, there exists the case where the errors are overlooked. In this case, the error detection capability can be improved by increasing the number of bits of the ID parity data. However, the parity data in the ID parity area 12 is redundant, and there exists a limit of the capacity of a storage medium. It is thus impossible to increase the ID area 12. Rather, there exists a need of reducing the ID area 12, as much as possible.

SUMMARY OF THE INVENTION

With these problems in mind, therefore, it is an object of the present invention to provide an error detection code forming method and apparatus which can improve the error detection capability markedly.

To achieve the above-mentioned object, the present invention provides a method for forming an error detection code for digital signals sequentially synthesized in units of blocks, each block being formed by adding a synchronization signal, identification (ID) data, a block error detection code, and an ID data error detection code, in units of bytes, to a fixed length unit formed by separating data, the method comprising the steps of: separating the ID data into four-bit units; and forming a Reed-Solomon code defined on a finite field $(2^4)$ on the basis of the separated ID data, as an error detection code.

Further, the present invention provides a method of forming identification (ID) data error detection codes to be synchronized at least with ID data and the digital data of fixed length, the method comprising the steps of: separating the ID data into four-bit units of data; adding a first data to each separated unit of four-bit data; delaying the data to which the first data is added by a period corresponding to each four-bit data; adding a second data to the delayed data; delaying the data to which the second data is added by the period corresponding to each four-bit data; multiplying the delayed data to which the second data is added by a coefficient $\alpha^4$ related to a Galois Field $(2^4)$ to generate the second data; and multiplying the delayed data to which the second data is added by a coefficient $\alpha$ related to the Galois Field $(2^4)$ to generate the first data, thus forming a two four-bit symbols of a Reed-Solomon code as an ID data error detection code.

Further, the present invention provides an apparatus for forming an identification (ID) error detection code to be synchronized at least with ID data and digital data of fixed length, the apparatus comprising: separating the ID data into four-bit units of data; first adding means for adding a first data to each separated four-bit unit of ID data; first delaying means for delaying the data to which the first data is added by a period corresponding to the four bits; second adding means for adding a second data to the delayed data; second delaying means for delaying the data to which the second data is added by the period corresponding to the four bits; first multiplying means for multiplying the data thus delayed by the second delaying means with a coefficient $\alpha^4$ related to Galois Field $(2^4)$ to generate the second data; and second multiplying means for multiplying the data thus delayed by the second delaying means by a coefficient $\alpha$ related to the Galois Field $(2^4)$ to generate the first data, thus forming two four-bit symbols of a Reed-Solomon code as an ID data error detection code.

Further, the present invention provides a method of detecting an error in identification (ID) data by means of an ID data error detection code synchronized at least with the ID data and digital data of fixed length, the method comprising the steps of: adding a first data, by using two as modulus, to a synchronized data composed at least of the digital data of fixed length divided into a plurality of data of four bits, the ID data and the ID data error detection codes, the ID data error detection code being formed of four-bit Reed-Solomon defined on a Galois Field ($2^4$); delaying the synchronized data to which the first data is added by a period corresponding to the four bits to generate the first data; adding a second data, by using two as modulus, to the synchronized data; delaying the synchronized data to which the second data is added by the period corresponding to the four bits; multiplying the delayed data to which the second data is added by a coefficient $\alpha$ related to the Galois Field ($2^4$) to generate the second data; and judging that the ID signal has no error when both the first and second data are zero.

DETAILED DESCRIPTION OF THE PREFERRED EMBODIMENTS

An embodiment of the error detection code forming method and apparatus according to the present invention will be described hereinbelow with reference to the attached drawings.

Figure 3:
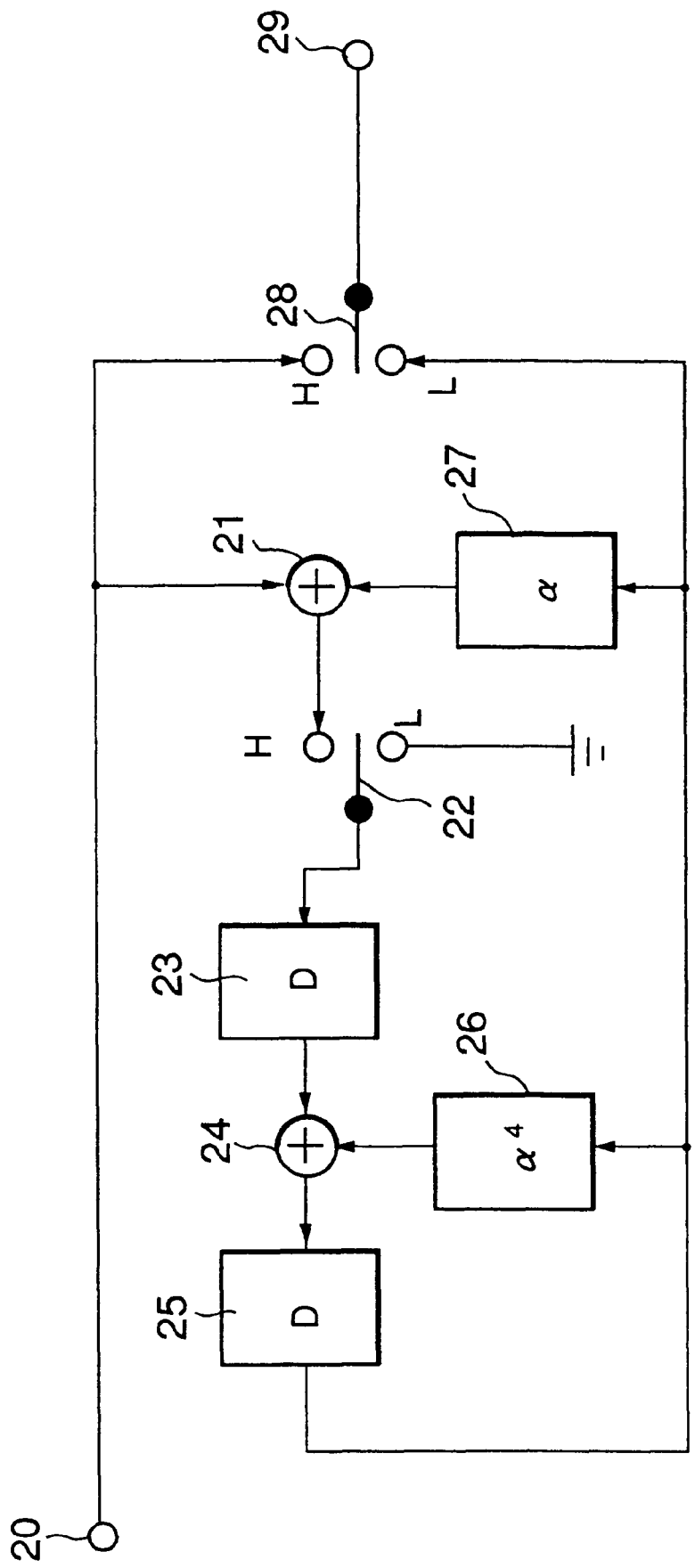
FIG. 3 is a block diagram showing an embodiment of the error detection code forming apparatus according to the present invention.
Figure 4:
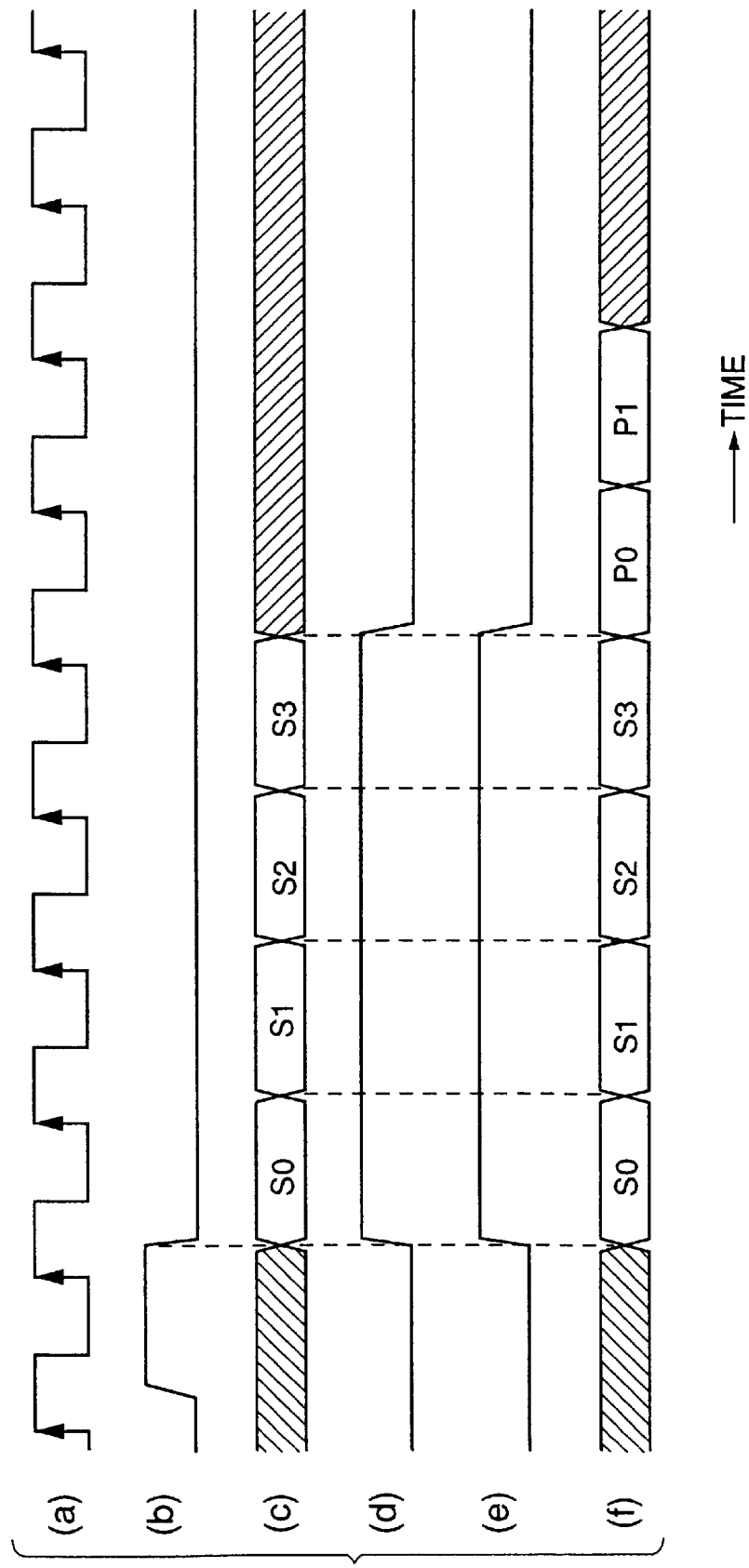
FIG. 4 is a timing chart for assistance in explaining the operation of the error detection code forming apparatus shown in FIG. 3.

FIG. 3 shows an error detection code forming apparatus according to the present invention, and FIG. 4 shows the timing chart for explaining the operation of the apparatus shown in FIG. 3. The error detection code forming apparatus shown in FIG. 3 is provided with a first adder 21, a first switch 22, a first delay circuit 23, a second adder 24, a second delay circuit 25, a first multiplier 26 for multiplying a coefficient $\alpha^4$, a second multiplier 27 for multiplying a coefficient $\alpha$, and a second switch 28. The second switch 28 changes the output data from four-bit ID data applied through an input terminal 20 to four-bit output data applied from the delay circuit 25 or vice versa, and outputs the switched four-bit data through an output terminal 29.

The respective elements of the error detection code forming apparatus shown in FIG. 3 operates in synchronism with a clock as shown in FIG. 4(a). Further, the first and second delay circuits 23 and 25 and the first and second multipliers 26 and 27 are all cleared by a clear pulse as shown in FIG. 4(b), before data are input to the input terminal 20.

Figure 2A:
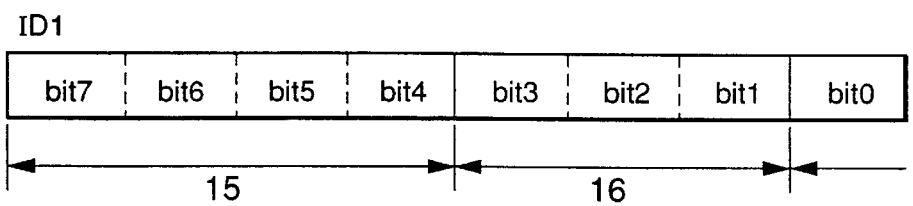
FIGS. 2(A), 2(B) and 2(C) are illustrations each showing a detail of the ID area shown in FIG. 1.
Figure 2B:
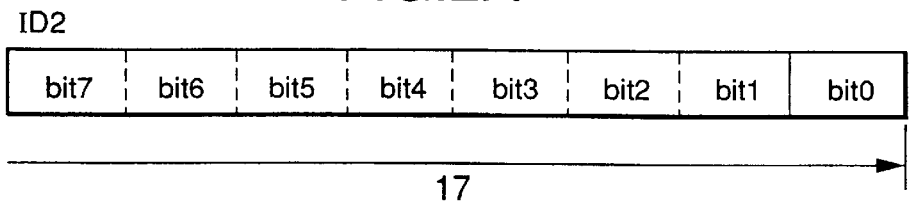
Figure 2C:
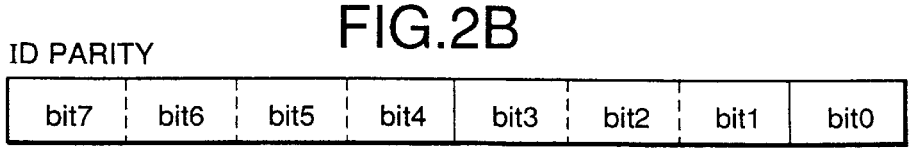

ID data 1 of eight-bit (one-byte) unit ID data 2 of eight-bit (one-byte) units is the same as the data ID1 and ID2 shown in FIGS. 2A and 2B, respectively, and are input 4 bits by 4 bits in parallel to each other in sequence through the input terminal 20 to the first adder 21 and a terminal H of the second switch 28, as symbol data.

In other words, as shown in FIG. 4(c), 16-bit ID data are input as four-bit symbol data in sequence of S0, S1, S2 and S3 in synchronism with the clock as shown in FIG. 4(a). While these four symbol data S0 to S3 are being input, a switch control signal applied to the first switch 22 is set to the high level as shown in FIG. 4(d) to set the first switch 22 to its terminal H. In the same way, a switch control signal applied to the second switch 28 is set to the high level as shown in FIG. 4(e) to set the second switch 28 to its terminal H.

Therefore, the four symbol data S0 to S3 input through the input terminal 20 are output to the output terminal 29 through the second switch 28 as they are, as shown in FIG. 4(f). Further, the four symbol data S0 to S3 are supplied to the first delay circuit 23 through the first adder 21 and the first switch 22. After having been delayed one-symbol period (corresponding to symbol data S0, for example) by the first delay circuit 23, the four delayed symbol data S0 to S3 are supplied to the second adder 24. The output data of the second adder 24 are further delayed the one-symbol period by the second delay circuit 25 and supplied to the first and second multipliers 26 and 27. The further delayed symbol data S0 to S3 are multiplied by two coefficients $\alpha^4$ and $\alpha$. The output data of the first and second multipliers 26 and 27 are supplied to the second and first adders 24 and 21, respectively, and then added to the output data of the first delay circuit 23 and to the symbol data input through the input terminal 20, respectively.

After that, at a moment when the fourth symbol data S3 have been all input, the switch control signals of the first and second switches 22 and 28 are both changed to a low level, as shown in FIGS. 4(d) and 4(e). The first and second switches 22 and 28 are then both set to their terminals L, so that the output terminal 29 is disconnected from the input terminal 20, and connected to an output end of the second delay circuit 25. Therefore, at a moment when the fourth symbol data S3 have been all inputted, the four-bit output data of the second delay circuit 25 are output, as parity data, to the output terminal 29 through the second switch 28 in sequence of P0 and P1, as shown in FIG. 4(f).

Here, the above-mentioned four-bit parity data P0 and P1 are Reed-Solomon code each defined on a finite field, that is, Galois Field (GF) $2^4$, which can be expressed by a primitive polynomial $x^4+x+1$ and a generating polynomial $(x+\alpha)\cdot(x+1)$ ($\alpha$: a primitive element of 0010). The parity data P0 and P1 forms a code word CW of 24 bits (=three bytes) in total together with the four symbol data S0 to S3 as follows:

$$CW = \sum_{i=0}^{5} Si \cdot x^{5-i}$$

where S4=P0 and S5=P1.

The generating polynomial $(x=\alpha)\cdot(x+1)$ equals $x^2+(\alpha+1)x+\alpha$. And, $\alpha^4$ is identical to $(\alpha+1)$ when calculated on the finite field GF defined by the primitive polynomial $x^4+x+1$. Thus, the expression $x^2+(\alpha+1)x+\alpha$ is identical to $x^2+\alpha^4x+\alpha$. These $\alpha^4$ and $\alpha$ correspond to the coefficients $\alpha^4$ and $\alpha$ of the multipliers 26 and 27, respectively.

As described above, in the present invention, the ID parity is defined by forming the Reed-Solomon code on the basis of multiplication obtained by using $x^5+x+1$ on a finite field GF ($2^4$) as modulus and by using α=(0010) as a primitive element. Therefore, instead of the one-byte parity quantity (the same as the conventional simple parity), two ID parity symbols can be formed on the basis of the four symbol data in unit of four bits, so that it is possible to improve the error detection capability of the ID data markedly, as compared with the conventional parity code.

Figure 1:
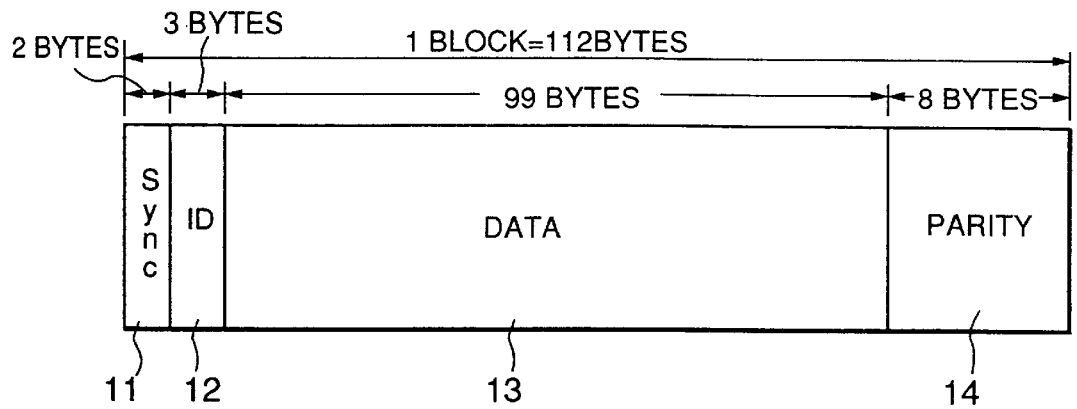
FIG. 1 is an illustration showing an example of a signal format for transmitting error detection codes.

As described above, a feature of the invention is that, with respect to FIG. 1, the error detection code (area 14) in a one-byte unit (8 bits) is attached to the data (area 13) while two ID error detection symbols each in a 4-bit unit are attached to the ID data (area 12). The entire block signal format according to the invention is the same as shown in FIG. 1.

Here, the construction and operation of a reproduction system (reception system) for the code words having the error correction codes formed as described above will be described hereinbelow.

Figure 5B:
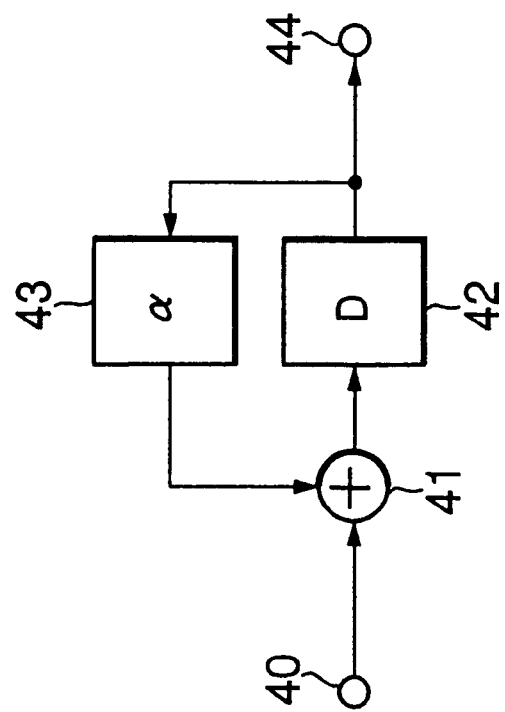
FIGS. 5A and 5B are block diagrams showing error detection circuits in the code word reproducing system (or reception system)
Figure 5A:
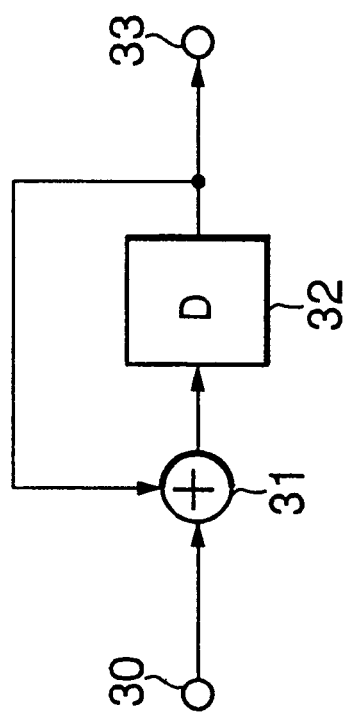
Figure 6:
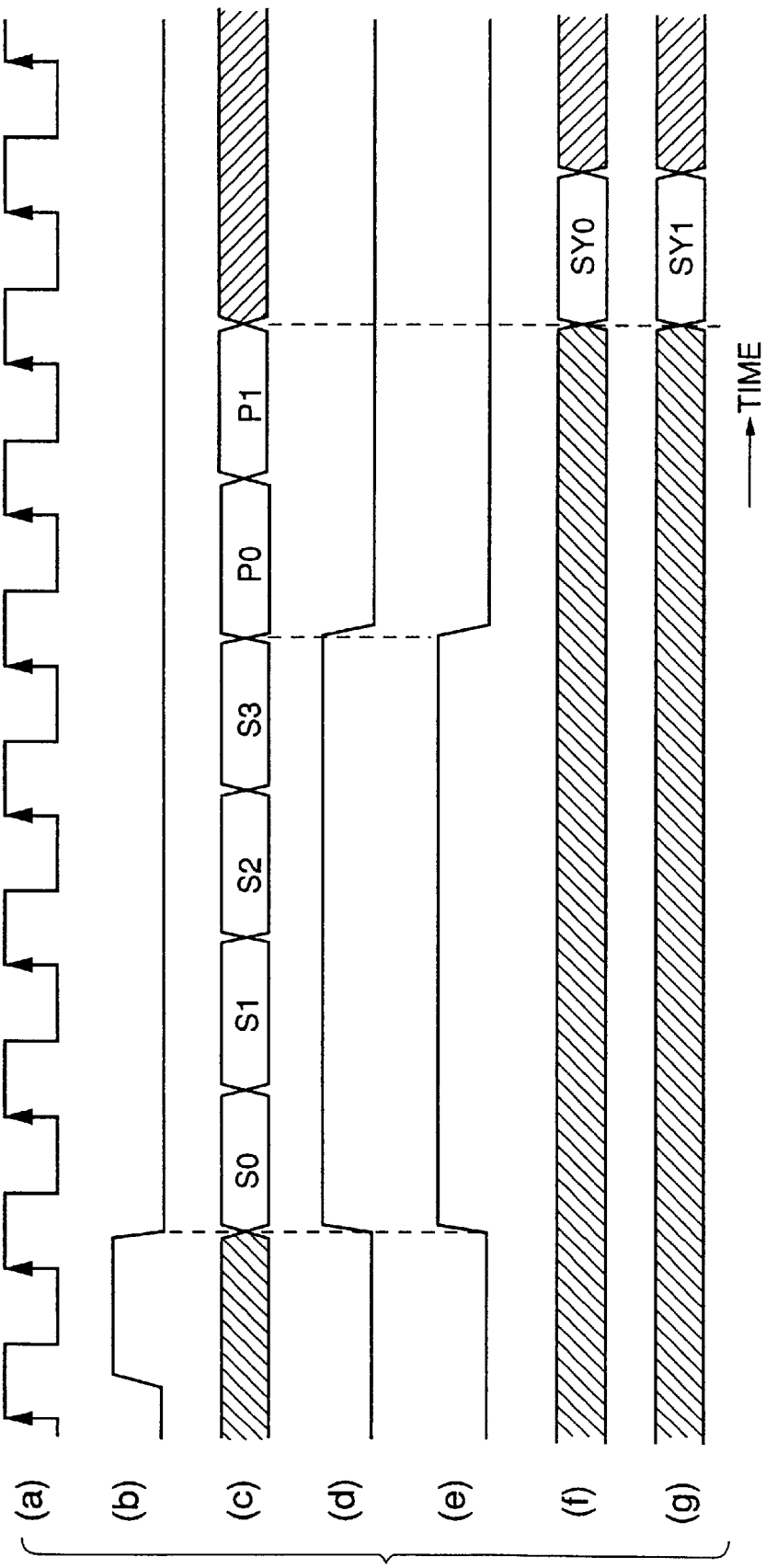
FIG. 6 is a timing chart for assistance in explaining the operation of the error detection circuit shown in FIGS. 5A and 5B.

FIGS. 5A and 5B show block diagrams each showing the reproduction system (reception system), and FIG. 6 shows a timing chart for assistance in explaining the operation thereof.

In the reproduction system (reception system) shown in FIG. 5A, four-bit reception signal data are input through an input terminal 30 in synchronism with the clock as shown in FIG. 6($a$), and then input to a delay circuit 32 via an adder 31 cleared by a clear pulse as shown in FIG. 6($b$). After having been delayed by one-symbol time by the delay circuit 32, the four-bit reception data are output through an output terminal 33 and further fed back to the adder 31.

Here, since four symbol data S0 to S3 and two ID parity symbols P0 and P1 are input to the input terminal 30 in sequence, as shown in FIG. 6($c$), a syndrome SY0 obtained by adding these six data in sequence by using 2 as modulus is output from the output terminal 33 at a timing as shown in FIG. 6($f$).

Further, in the reproduction system (reception system) shown in FIG. 5B, four-bit reception signal data are input through an input terminal 40 in synchronism with the clock as shown in FIG. 6($a$), and then input to a delay circuit 42 via an adder 41 cleared by a clear pulse as shown in FIG. 6($b$). After having been delayed by one-symbol time, the four-bit reception data are output through an output terminal 44 and further fed back to the adder 41 via a multiplier 43 (after having been multiplied by a coefficient α).

Here, four symbol data S0 to S3 and two ID parity symbols P0 and P1 are input to the input terminal 40 in sequence, as shown in FIG. 6($c$). The input data are added to a value obtained by multiplying the preceding data among these six data by the coefficient α by using 2 as modulus, and further the succeeding data are added to a value obtained by multiplying the obtained addition result data by the coefficient α by using 2 as modulus. That is, a syndrome SY1 obtained by repeating the above-mentioned additions is outputted in sequence from the output terminal 44 at a timing as shown in FIG. 6($g$). Further, FIGS. 6($d$) and 6($e$) indicate the control signals of the circuits shown in FIGS. 5A and 5B, respectively. Therefore, when the two syndromes SY0 and SY1 obtained as described above are both at "0", it can be judged that there is no error.

As described above, since the ID parity detecting circuit is constructed for detecting the Reed-Solomon code on the finite field GF ($2^4$), the detecting circuit can be constructed simply, as compared with the conventional error detecting circuit.

Further, the present invention is not limited only to the above-mentioned embodiment. For instance, as far as an addition of the ID data and the ID parity code is less than 4×15 bits, any combination of both can be adopted. Further, in the above-mentioned embodiment, although the primitive polynomial $x^4+x+1$ is used to introduce the finite field on GF ($2^4$), another primitive polynomial (e.g., $x^4+x^2+1$) can be also used. Further, with respect to the generating polynomial of (x+α)·(x+1), another generating polynomial (e.g., (x+α²)·(x+1)) can be also used.

As described above, in the error detection code forming method and apparatus according to the present invention, the ID data are input as symbol data for each four-bit unit and further the Reed-Solomon code defined on the finite field GF ($2^4$) is used as the ID data error detection code. It is thus possible to improve the ID data detection capability markedly, as compared with the convention ID data error detection code using an eight (3, 2, 2) code, in spite of the fact that the same parity quantity is used. Further, since the parity forming apparatus can form the Reed-Solomon code defined on the finite field GF ($2^4$), it is possible to simplify the circuit construction by using only 16 bits.

What is claimed is:

1. A method of forming an identification (ID) error detection code to be synchronized at least with ID data and digital data of fixed length, the method comprising the steps of:

separating the ID data into four bit units of data;

adding a first data to each separated four-bit unit of data;

delaying the four-bit units of data to which the first data is added by a period corresponding to each four-bit unit of data;

adding a second data to the delayed data;

delaying the delayed data to which the second data is added by the period corresponding to each four-bit unit of data;

multiplying the delayed data to which the second data is added by a coefficient $α^4$ related to a Galois Field ($2^4$) to generate the second data; and multiplying the delayed data to which the second data is added by a coefficient α related to the Galois Field ($2^4$) to generate the first data, the four-bit Reed-Solomon code defined on the Galois Field ($2^4$) being formed, the Reed-Solomon code becoming the ID data error detection code, wherein each Reed-Solomon code is expressed by a primitive polynomial $x^4+x+1$ and a generating polynomial (x+α)·(x+1), wherein α is a primitive element of 0010.

2. A method of forming an identification (ID) error detection code to be synchronized at least with ID data and digital data of fixed length, the method comprising the steps of:

separating the ID data into four bit units of data;

adding a first data to each separated four-bit unit of data;

delaying the four-bit units of data to which the first data is added by a period corresponding to each four-bit unit of data;

adding a second data to the delayed data;

delaying the delayed data to which the second data is added by the period corresponding to each four-bit unit of data;

multiplying the delayed data to which the second data is added by a coefficient $α^4$ related to a Galois Field ($2^4$) to generate the second data; and multiplying the delayed data to which the second data is added by a coefficient α related to the Galois Field ($2^4$) to generate the first data, the four-bit Reed-Solomon code defined on the Galois Field ($2^4$) being formed, the Reed-Solomon code becoming the ID data error detection code, wherein each Reed-Solomon code is expressed by a primitive polynomial $x^4+x^2+1$ and generating polynomial $(x+\alpha^2)\cdot(x+1)$, wherein $\alpha$ is a primitive element of 0010.

* * * * *